(12) United States Patent
Eisner et al.

(10) Patent No.: US 8,637,838 B2
(45) Date of Patent: Jan. 28, 2014

(54) SYSTEM AND METHOD FOR ION IMPLANTATION WITH IMPROVED PRODUCTIVITY AND UNIFORMITY

(75) Inventors: Edward C. Eisner, Lexington, MA (US); Bo H. Vanderberg, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 226 days.

(21) Appl. No.: 13/324,050

(22) Filed: Dec. 13, 2011

(65) Prior Publication Data

US 2013/0146760 A1 Jun. 13, 2013

(51) Int. Cl.
*H01J 37/147* (2006.01)
*H01J 37/317* (2006.01)
*H01J 37/08* (2006.01)
*H01J 49/26* (2006.01)

(52) U.S. Cl.
USPC ............... 250/492.21; 250/396 R; 250/492.2; 250/492.3; 250/298

(58) Field of Classification Search
USPC ................. 250/281, 282, 294, 296, 298, 299, 250/396 R, 492.1, 492.2, 492.21, 492.3
See application file for complete search history.

(56) References Cited

U.S. PATENT DOCUMENTS

| | | | |
|---|---|---|---|
| 5,481,116 A | 1/1996 | Glavish et al. | |
| 5,672,879 A | 9/1997 | Glavish | |
| 7,498,572 B2 | 3/2009 | Fujita | |
| 7,615,763 B2 * | 11/2009 | Vanderberg et al. | 250/492.21 |
| 8,008,636 B2 * | 8/2011 | Eisner | 250/492.21 |
| 8,278,634 B2 * | 10/2012 | Vanderberg et al. | 250/492.21 |
| 8,502,173 B2 * | 8/2013 | Vanderberg et al. | 250/492.21 |
| 2008/0067436 A1 * | 3/2008 | Vanderberg et al. | 250/492.21 |
| 2008/0067444 A1 | 3/2008 | Benveniste et al. | |
| 2010/0155623 A1 * | 6/2010 | Eisner | 250/492.21 |
| 2010/0308215 A1 * | 12/2010 | Vanderberg et al. | 250/281 |
| 2013/0026356 A1 * | 1/2013 | Vanderberg et al. | 250/281 |

* cited by examiner

*Primary Examiner* — Bernard E Souw
(74) *Attorney, Agent, or Firm* — Eschweiler & Associates, LLC

(57) ABSTRACT

A scanning system including a scanning element, a beam profiler, analysis system, and a ZFE-limiting element, is disclosed. The scanning element is configured to scan an ion beam over an ion beam scan path. The beam profiler measures beam current of the ion beam as it is scanned over the ion beam scan path, and the analysis system analyzes the measured beam current to detect a ZFE condition. The ZFE-limiting element, which is upstream of the beam profiler and is coupled to the analysis system via a feedback path, is configured to selectively apply an electric field to the scanned ion beam based on whether the ZFE condition is detected. The selectively applied electric field induces a change in the scanned beam to limit the ZFE condition.

20 Claims, 8 Drawing Sheets

US 8,637,838 B2

SYSTEM AND METHOD FOR ION IMPLANTATION WITH IMPROVED PRODUCTIVITY AND UNIFORMITY

FIELD

The present disclosure relates generally to ion implantation systems, and more specifically to methods and apparatus for improving productivity and uniformity of a scanned ion beam.

BACKGROUND

In ion implantation systems, an ion beam is directed towards a workpiece (e.g., a semiconductor wafer, or a display panel) to implant ions into a lattice thereof. Once embedded into the lattice of the workpiece, the implanted ions change the physical and/or chemical properties of the implanted workpiece regions, relative to un-implanted regions. Because of this ability to change material properties, ion implantation can be used in semiconductor device fabrication, metal finishing, and various applications in materials science research.

During a typical implantation process, the ion beam has a cross-sectional area that is significantly smaller than the surface area of a workpiece to be implanted. Because of this, ion beams are scanned over the surface of the workpiece to achieve a specified uniformity of doping profile in the workpiece, where the doping profile consists of a desired depth distribution at a desired volumetric concentration. For example, FIG. 1 shows an end view of a conventional ion implantation system 100 where an ion beam 102 traces over a scan path 103 to implant ions into the lattice of a workpiece 104. During this tracing, the ion beam 102 is often scanned over a first axis 105 while the workpiece 104 is mechanically translated over a second axis 106. However, in other embodiments the beam could also be scanned over both the first and second axes 105, 106; could be magnetically and electrically scanned over the axes 105, 106, respectively; and so on.

In practice, as the ion beam 102 traces over the scan path 103, the shape and/or cross-sectional area of the beam can vary, such as shown in FIGS. 1B-1F, for example. FIGS. 1B-1F show the ion beam 102 scanning across the workpiece 104, where the width of the beam can be larger (e.g., more diffuse) near the center of the workpiece (central width $W_c$ in FIG. 1D) and smaller (e.g., more focused) near the edges (e.g., left and right widths, $W_{L1}$, $W_{R1}$ as shown in FIGS. 1B, 1F, respectively). If these variations in beam width and/or associated current density are not accurately measured and accounted for, the uniformity of doping profile actually formed in the workpiece 104 can differ from the specified uniformity. Such non-uniformity can result in the implanted workpiece yielding fewer functioning electronic devices than desired.

One underlying cause of such beam variations can be the so-called zero-field effect (ZFE), which may also be referred to as zero field anomaly (ZFA). ZFE often occurs when the magnitude of a scanning field, either electric or magnetic, approaches zero, thereby causing a sudden "spike" or "dip" in beam current, while the zero magnitude scanning field is applied. FIG. 2A shows an example of a beam scanning waveform 204, which can be used to scan the ion beam back and forth over the scan path (e.g., as shown in FIG. 1). As can be seen when viewing FIG. 2A-2B simultaneously, when the beam scanning waveform 204 is near zero (206 in FIG. 2A), a sudden spike in beam current 202 (FIG. 2B) can occur. Absent countermeasures, this beam current "spike" 202 can cause the part of the workpiece encountering the ZFE to be implanted differently from specified, resulting in detrimental non-uniformity on a workpiece.

The exact cause of the ZFE is not clear, however it likely has to do with beam neutralization, i.e., the transport enhancement that occurs when the space-charge of the ion beam is cancelled by a medium with opposing electric charge in a beam line, such as for example a neutralizing beam plasma generated via collisions of beam ions with the neutral background gas. The ZFE may be the result of the magnetic field, or the induced electric field (e.g., due to the time varying magnetic field), forcing neutralizing electrons out of the beam line area (e.g., the magnetic or induced electric field acts upon the electrons with a force that pushed them out of the beam line) and thereby reducing charge neutrality and leading to transport enhancement or reduction (e.g., providing more or less beam current depending on how charge neutralization affects beam transport). However, regardless of the cause of ZFE, the result of the zero field effect is an uneven beam current profile that may result in a non-uniform implant on the workpiece.

Accordingly, aspects of the present disclosure are directed toward improved ion implantation systems that mitigate ZFE.

SUMMARY

The present invention is directed to an ion implantation system configured to reduce the ZFE while increasing overall productivity. One aspect of the invention provides an ion implantation system that uses a scanning element to scan the beam, which can give rise to ZFE. To mitigate ZFE, a beam profiler measures the beam current while the beam is being scanned (e.g., during initialization or during actual implantation), and analysis circuitry analyzes the measured beam current to detect a ZFE condition occurring in at least one scan position on the ion beam scan path. An ZFE-limiting element, which can be close to the scanning element and coupled to the analysis circuitry via a feedback path, is configured to selectively apply a time-varying electric field to the scanned ion beam based on whether the ZFE condition is detected. The selectively applied electric field induces a change in the scanned beam at the at least one scan position to limit the ZFE condition.

Accordingly, techniques for reducing the zero field effect and improving productivity and uniformity of a scanned beam are provided herein.

BRIEF DESCRIPTION OF THE DRAWINGS

The following description and the annexed drawings set forth in detail certain illustrative aspects and implementations of the invention. These are indicative, however, of but a few of the various ways in which the principles of the invention may be employed.

DETAILED DESCRIPTION

Figure 1A:
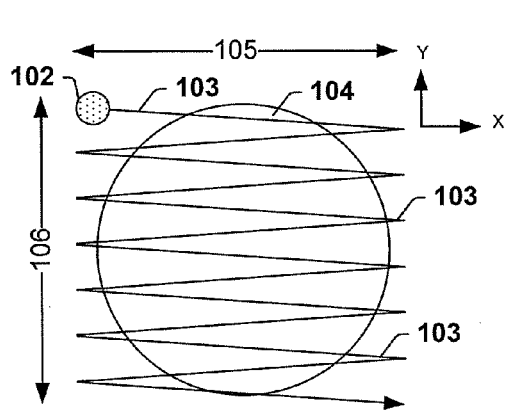
FIG. 1A is an end view illustrating a scanned ion beam tracing out a scan path to implant ions into a workpiece.
Figure 1B:
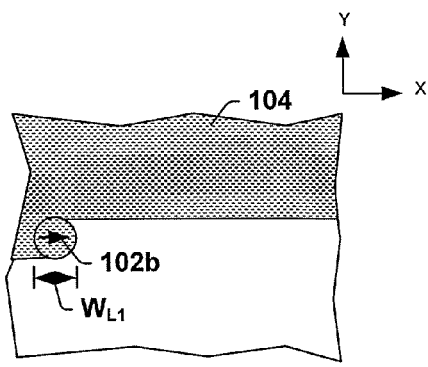
FIGS. 1B-1F show beam size variations that can arise when an ion beam scans over a surface of a workpiece.
Figure 1C:
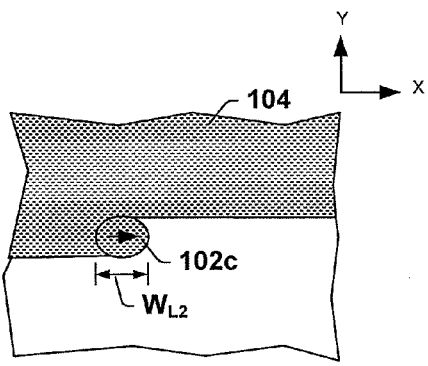
Figure 1D:
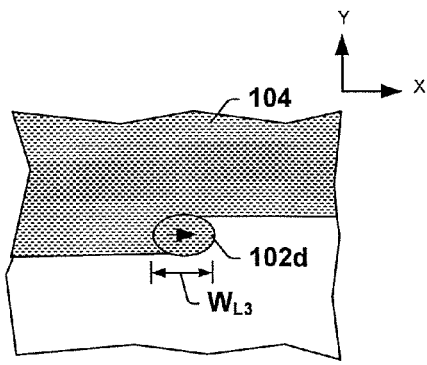
Figure 1E:
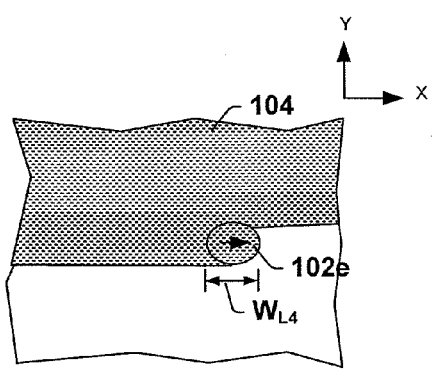
Figure 1F:
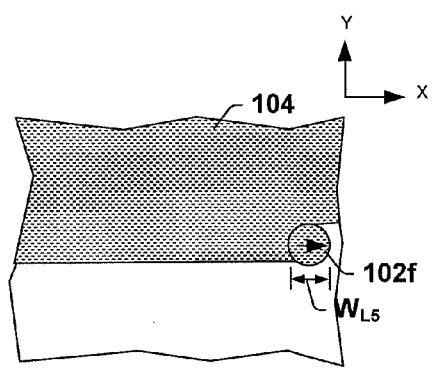
Figure 2A:
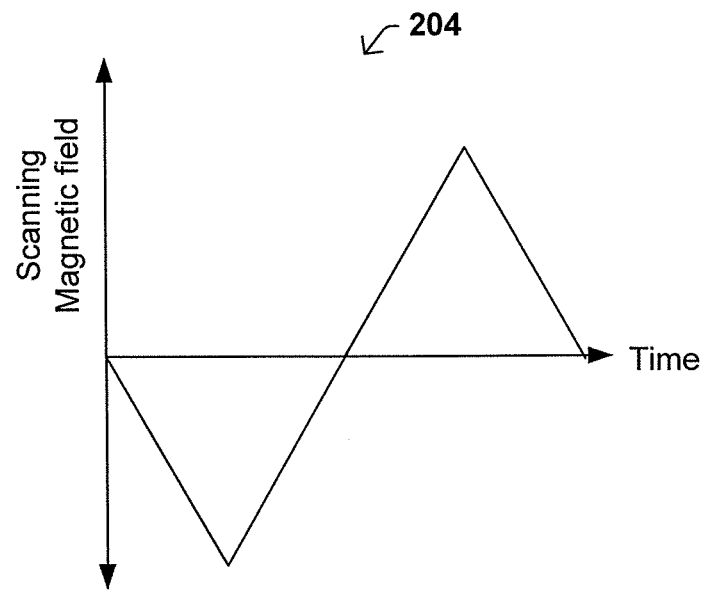
FIGS. 2A and 2B illustrate a scan waveform and a corresponding beam current density plot, respectively, which illustrate one example of ZFE.
Figure 2B:
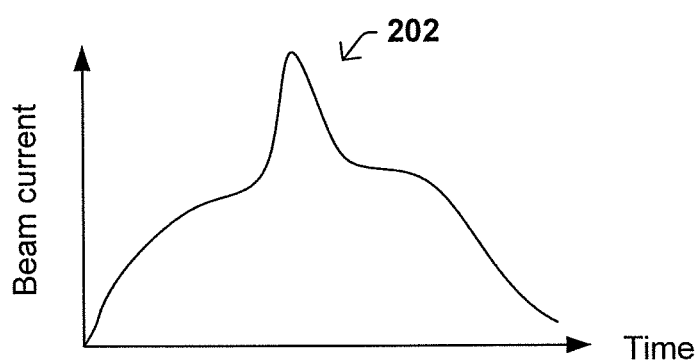

The present invention will now be described with reference to the drawings wherein like reference numerals are used to refer to like elements throughout.

Figure 3:
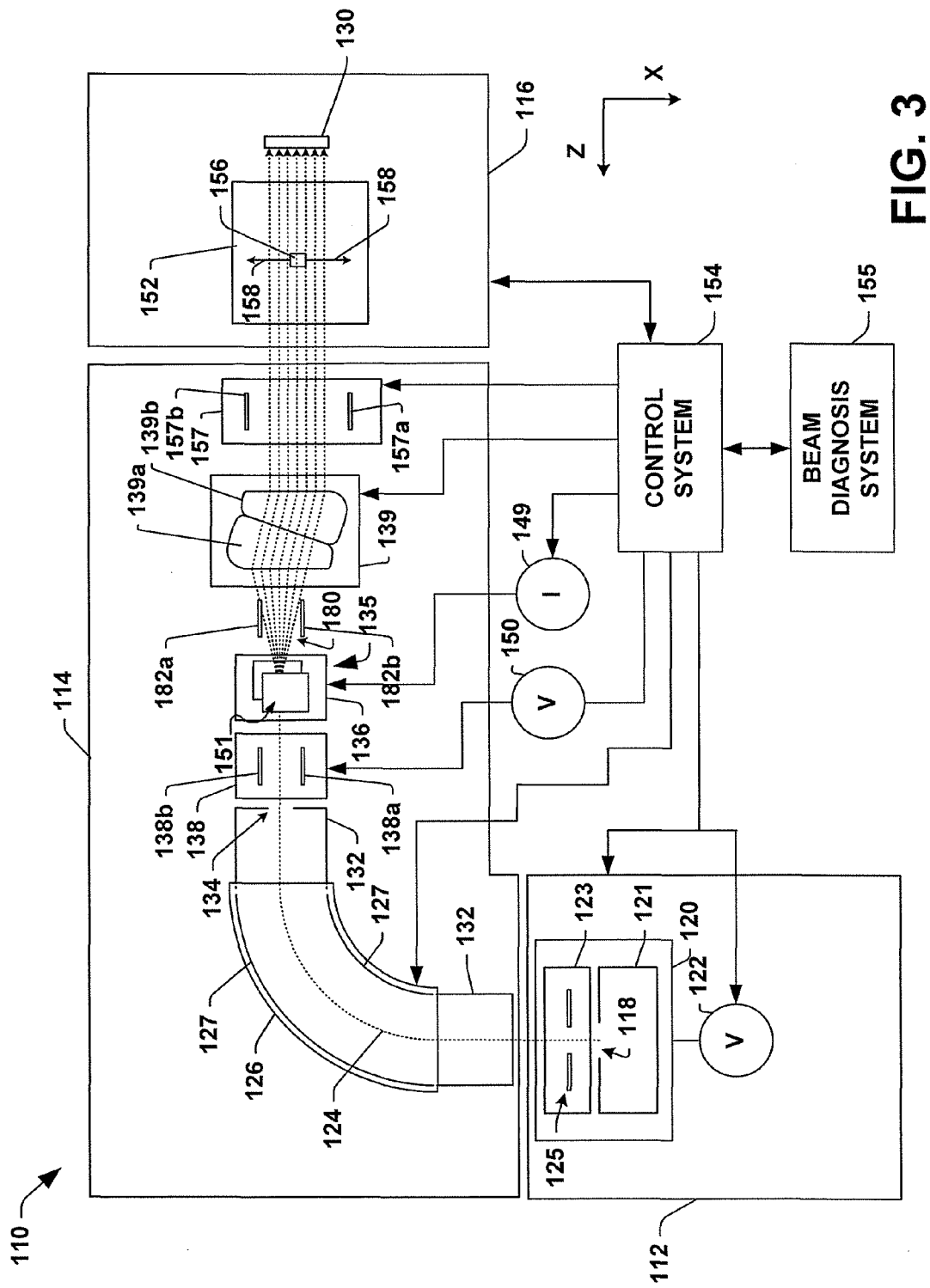
FIG. 3 is schematic a block diagram illustrating an ion implanter in accordance with some embodiments.

FIG. 3 illustrates an exemplary ion implantation system 110 in accordance with some embodiments. As will be appreciated further herein, the ion implantation system 110 makes use of a scanner 135 to scan the beam, which can lead to a ZFE condition that can be detected by a beam profiling system 152. If a ZFE condition is detected, the beam profiling system 152 provides feedback to a ZFE-limiting element 180 to apply a time-variant electric field to the magnetically scanned beam to correct the ZFE. In many instances, the ZFE-limiting element only applies an electric field when a ZFE condition is detected. If a ZFE condition is not detected, the ZFE-limiting element can leave its electric field off (or in some other static state). This system 110 is presented for illustrative purposes and it is appreciated that this disclosure is not limited to the described ion implantation system and that other suitable ion implantation systems can also be employed.

The system 110 has a terminal 112, a beamline assembly 114, and an end station 116. The terminal 112 includes an ion source 120 powered by a high voltage power supply 122 that produces and directs an ion beam 124 to the beamline assembly 114. The ion source 120 generates ions that are extracted and formed into the ion beam 124, which is directed along a beam path in the beamline assembly 114 to the end station 116.

To generate the ions, a gas of a dopant material (not shown) to be ionized is located within a generation chamber 121 of the ion source 120. The dopant gas can, for example, be fed into the chamber 121 from a gas source (not shown). In addition to power supply 122, it will be appreciated that any number of suitable mechanisms (none of which are shown) can be used to excite free electrons within the ion generation chamber 121, such as RF or microwave excitation sources, electron beam injection sources, electromagnetic sources and/or a cathode which creates an arc discharge within the chamber, for example. The excited electrons collide with the dopant gas molecules and generate ions. Typically, positive ions are generated although the disclosure herein is applicable to systems wherein negative ions are generated as well.

The ions are controllably extracted through a slit 118 in the chamber 121 by an ion extraction assembly 123, in this example. The ion extraction assembly 123 comprises a plurality of extraction and/or suppression electrodes 125. The extraction assembly 123 can include, for example, a separate extraction power supply (not shown) to bias the extraction and/or suppression electrodes 125 to accelerate the ions from the generation chamber 121. It can be appreciated that since the ion beam 124 comprises like charged particles, the beam may have a tendency to blow up or expand radially outwardly as the like charged particles repel one another. It can also be appreciated that beam blow up can be exacerbated in low energy, high current (high perveance) beams where many like charged particles (e.g., high current) are moving in the same direction relatively slowly (e.g., low energy) such that there is an abundance of repulsive forces among the particles. Accordingly, the extraction assembly 123 is generally configured so that the beam is extracted at a high energy so that the beam does not blow up. Moreover, the beam 124, in this example, is generally transferred at a relatively high energy throughout the system and is reduced just before the workpiece 130 to promote beam containment.

The beamline assembly 114 has a beamguide 132, a mass analyzer 126, a scanning system 135, electric element 180, and a parallelizer 139. The mass analyzer 126, in this example, is formed at about a ninety degree angle and comprises one or more magnets (not shown) that serve to establish a (dipole) magnetic field therein. As the beam 124 enters the mass analyzer 126, it is correspondingly bent by the magnetic field such that ions of an inappropriate charge-to-mass ratio are rejected. More particularly, ions having too great or too small a charge-to-mass ratio are deflected into side walls 127 of the beamguide 132. In this manner, the mass analyzer 126 merely allows those ions in the beam 124 which have the desired charge-to-mass ratio to pass there-through and exit through a resolving aperture 134. It will be appreciated that ion beam collisions with other particles in the system 110 can degrade beam integrity. Accordingly, one or more pumps (not shown) may be included to evacuate, at least, the beamguide 132 and extraction assembly 123.

The scanning system 135 in the illustrated example includes a magnetic or electric scanning element 136 and a magnetic or electrostatic focusing and/or steering element 138. Respective power supplies 149, 150 are operatively coupled to the scanning element 136 and the focusing and steering element 138, and more particularly to respective pole pieces and electrodes 138$a$, 138$b$ located therein. The focusing and steering element 138 receives the mass analyzed ion beam 124 having a relatively narrow profile (e.g., a "pencil" beam in the illustrated system 110). A voltage applied by the power supply 150 to the plates 138$a$ and 138$b$ operates to focus and steer the beam to the scan vertex 151 of the scanning element 136. A current waveform applied by the power supply 149 to coils surrounding the pole pieces form a time varying field that then scans the beam 124 back and forth to form a scanned ion beam 131 having a time-varying scan angle measured relative to the beam path of the un-scanned beam 124, in this example. It will be appreciated that the scan vertex 151 can be defined as the point in the optical path from which each beamlet or scanned part of the ribbon beam appears to originate after having been scanned by the scanning element 136.

As previously described, ion beam scanners, such as the scanning element 136 in FIG. 3, may be subject to the zero field effect (ZFE), which is an anomalous transport phase that occurs when the electric or magnetic field in the scanning element has zero or close to zero amplitude. The ZFE can result in an irregular flux profile of the scanned ribbon beam 131 wherein the current density is temporarily increased or decreased when the field of the scanner has a zero or close to zero amplitude.

Consequently, the presently disclosed techniques limit ZFE by using a beam profiling system 152 to measure beam current of the scanned ion beam 131 over the scan path downstream of the scanner 135. Analysis circuitry (e.g., beam diagnosis system 155) then analyzes the measured beam current to detect a ZFE condition. For example, the beam diagnosis system 155 can look for a sudden spike or dip in the beam current, relative to a baseline beam current to detect ZFE. A ZFE limiting element 180, which is coupled to the analysis circuitry via a wired or wireless feedback path, then selectively applies an electric field to the ZFE-affected region of the beam path to limit the ZFE condition. The selective application of the electric field depends on whether the ZFE condition is detected—for example, if ZFE condition is detected, then electric field is changed or is turned on; but if ZFE condition is not detected, then electric field remains unchanged or is turned off. Thus, in many instances, the electric field applied by the ZFE-limiting element 180 is applied only when a ZFE occurs. At other times when no ZFE is detected, the ZFE limiting element 180 does not apply an electric field to the beamline.

In one embodiment, the ZFE limiting element 180 includes first and second electrode plates 182a, 182b, which are downstream of the scanner 136, although fewer electrode plates (e.g., a single electrode plate) or more electrode plates could also be used. A preferred embodiment uses a single plate in proximity to the beam, capable of attracting or repelling electrons from the beam plasma. A voltage is selectively applied to the one or more electrode plates (e.g., 182a, 182b) to induce the selective ZFE-limiting electric field, based on whether a ZFE condition is detected. In alternative embodiments, the voltage is applied to a ring-shaped electrode in the vicinity of the scanner 136 to induce the selective, ZFE-limiting electric field, although other electrode arrangements are also possible. In general, the electric field may be introduced at any location near the scanner 136 to limit the effect of ZFE.

The scanned beam 131 is then passed through the parallelizer/corrector 139, which comprises two dipole magnets 139a, 139b in the illustrated example. The shaped traced by the magnetic field lines of the dipoles can be substantially trapezoidal and oriented to mirror one another to cause the scanned beam 131 to bend into a substantially s shape. Stated another way, the dipoles induce bends in the ion beam path that have equal angles and radii and opposite directions of curvature.

The parallelizer 139 causes the scanned beam 131 to alter its path such that the beam 131 travels parallel to a beam axis regardless of the scan angle. As a result, the implantation angle is distributed relatively uniformly across the workpiece 130.

One or more deceleration stages 157 are located downstream of the parallelization component 139 in this example. Up to this point in the system 110, the beam 131 is generally transported at a relatively high energy level to mitigate the propensity for beam blow up, which can be particularly high where beam density is elevated such as at the resolving aperture 134, for example. The deceleration stage 157 comprises one or more electrodes 157a, 157b operable to decelerate the scanned beam 131. The electrodes 157 are typically apertures through which the beam travels and may be drawn as straight lines in FIG. 1.

It will be appreciated that while two electrodes, 125a and 125b, 138a and 138b and 157a and 157b, are respectively illustrated in the exemplary ion extraction assembly 123, focusing and steering element 138 and deceleration stage 157, that these elements 123, 138 and 157 may comprise any suitable number of electrodes arranged and biased to accelerate and/or decelerate ions, as well as to focus, bend, deflect, converge, diverge, scan, parallelize and/or decontaminate the ion beam 124. Additionally, the focusing and steering element 138 may comprise electrostatic deflection plates (e.g., one or more pairs thereof), as well as an Einzel lens, quadrupoles and/or other focusing elements to focus the ion beam.

The end station 116 then receives the ion beam 131 which is directed toward a workpiece 130. It is appreciated that different types of end stations 116 may be employed in the implanter 110. For example, a "batch" type end station can simultaneously support multiple workpieces 130 on a rotating support structure, wherein the workpieces 130 are rotated through the path of the ion beam until all the workpieces 130 are completely implanted. A "serial" type end station, on the other hand, supports a single workpiece 130 along the beam path for implantation, wherein multiple workpieces 130 are implanted one at a time in serial fashion, with each workpiece 130 being completely implanted before implantation of the next workpiece 130 begins. In hybrid systems the workpiece 130 may be mechanically translated in a first (Y or slow scan) direction while the beam is scanned in a second (X or fast scan) direction to impart the beam 131 over the entire workpiece 130.

The end station 116 in the illustrated example is a "serial" type end station that supports the single workpiece 130 along the beam path for implantation. A beam profiling system 152 is included in the end station 116 near the workpiece location for calibration measurements prior to implantation operations. During calibration, the beam 131 passes through beam profiling system 152. The beam profiling system 152 may comprise a measurement element configured to measure a beam current or density of the ion beam. In one embodiment the measurement element may include a faraday cup. In an alternative embodiment, the measurement element may comprise one or more profilers 156 that may continuously traverse a profiler path 158, thereby measuring the profile of the scanned beams.

The profiler 156, in this example, may comprise a current density sensor, such as a Faraday cup, for example, that measures the current density of the scanned beam, where current density is amongst other a function of the angle of implantation (e.g., the relative orientation between the beam and the mechanical surface of the workpiece and/or the relative orientation between the beam and the crystalline lattice structure of the workpiece). The current density sensor moves in a generally orthogonal fashion relative to the scanned beam and thus typically traverses the width of the ribbon beam.

A control system 154 is present that can control, communicate with and/or adjust the ion source 120, the mass analyzer 127, the scanning element 136, the parallelizer 139, the ZFE-limiting element 180, and the beam profiling system 152. The control system 154 may comprise a computer, microprocessor, etc., and may be operable to take measurement values of beam characteristics (e.g., the beam current or density) and adjust parameters (e.g., electric field applied to magnetically scanned beam) accordingly. The control system 154 can be coupled to the terminal 112 from which the beam of ions is generated, as well as the mass analyzer 126 of the beamline assembly 114, the scanning element 136 (e.g., via power supply 149), the focusing and steering element 138 (e.g., via power supply 150), the parallelizer 139, and the deceleration stage 157. Accordingly, any of these elements can be adjusted by the control system 154 to facilitate desired ion beam properties. For example, the energy level of the beam can be adapted to adjust junction depths by adjusting the bias applied to electrodes in the ion extraction assembly 123 and the deceleration stage 157, for example. The strength and orientation of magnetic field generated in the mass analyzer 126 can be adjusted, such as by regulating the amount of electrical current running through field windings therein to alter the curvature of the path of the desired ion beam, for example. The angle of implantation can be further controlled by adjusting the voltage applied to the steering element 138, for example.

In one particular embodiment, beam diagnosis system 155 connected to the controller system is configured to vary the amplitude of a voltage applied to the electrodes of the ZFE-limiting element 180 in response to the measured beam current or density. For example, if a measured beam current or density indicates a ZFE is present, then the controller 154 will communicate to the ZFE-limiting element 180 to apply a higher voltage to the electrodes of the ZFE-limiting element. The addition of a higher voltage can induce a corresponding change in electric field to change (e.g., enhance) the beam current or density in regions where a non-zero scanning field is acting upon the ion beam by changing beam neutralization. The change in beam current or density can result in a larger overall beam current or density over the wafer and a mitigation of ZFE.

Therefore, the beam diagnosis system 155 and the control system 154 allow for an iterative method of ion beam tuning by which the beam current or density is tuned, through the iterative incremental changes in the amplitude of the waveform applied to the ZFE-limiting element to remove the effects of ZFE.

A more detailed embodiment of the interaction of the scanning system 135, ZFE-limiting element 180, and beam profiling system 152 is illustrated in FIGS. 4A-4G.

Figure 4A:
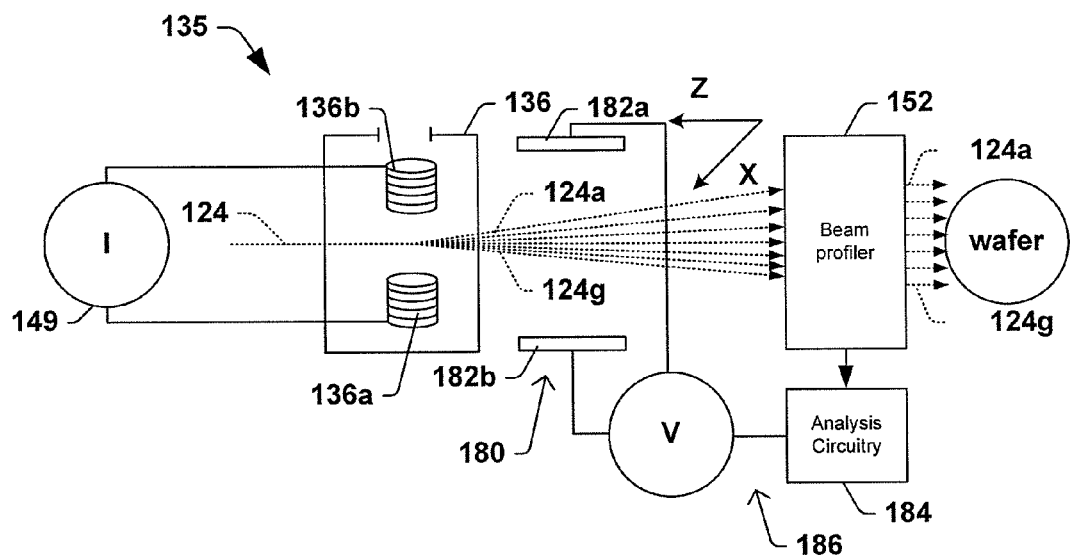
FIGS. 4A-4G illustrate a magnetic beam scanning system that can induce a ZFE condition, wherein a beam profiler and an electric scanning element are used to limit the ZFE condition.

As shown in FIG. 4A, the scanning system 135 comprises a scanner region having a first element 136a and a second element 136b on either lateral side of the beam path 124. The elements are separated by a gap comprising a vacuum, through which the beam path 124 runs. In one embodiment exemplifying magnetic scanning magnetic poles, 136a and 136b, may comprise electromagnetic coils. It will be appreciated that the electric scanning case is analogous.

Figure 4B:
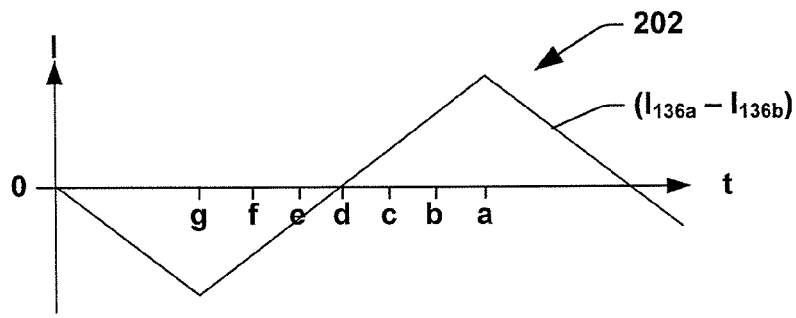

In viewing waveform diagram 202 in FIG. 4B along with FIG. 4A's block diagram, the magnetic poles may be coupled to a current source 149, configured to provide alternating currents to the magnetic poles 136a and 136b. The time varying current between the magnetic poles forms a time varying magnetic field 204, as illustrated in a waveform diagram in FIG. 4C. This magnetic field extends outward from the coils across the beam path, and causes the beam 124 to bend or deflect (e.g., scan) along a scan direction (e.g., the X direction in FIGS. 4A and 4G). When the scanner magnetic field is in the direction from the pole 136a to the pole 136b, the ions of the beam 124 are subjected to a lateral force in the positive X direction (e.g., according to Lorentz' force equation $F=q(v \times B)$. When the poles 136a and 136b are subjected to zero current there is zero magnetic field in the scanner 136 (e.g., such as at time "d" in FIG. 4G) and the beam 124 passes through the scanner 136 unmodified. When the field is in the direction from the pole 136b to the pole 136a (e.g., times "a" and "c" in FIG. 4G), the ions of the beam 124 are subjected to a lateral force in the negative X direction).

Figure 4C:
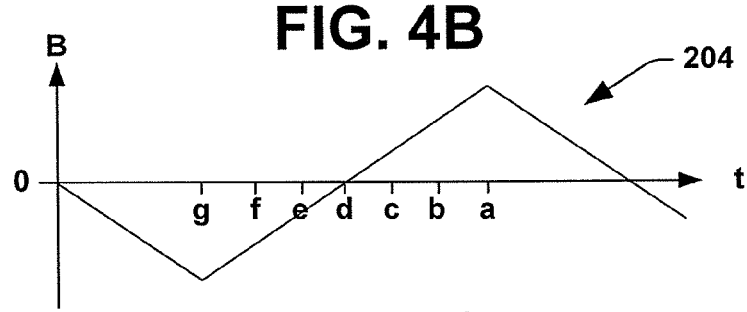
Figure 4D:
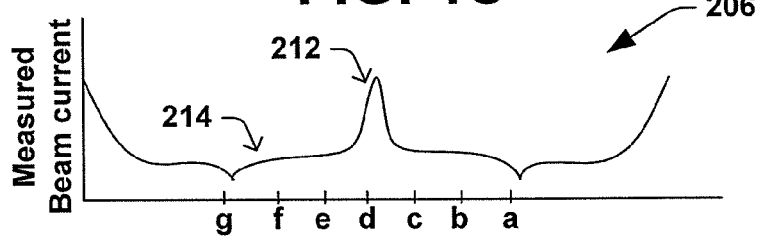

FIG. 4D shows the beam current 206 detected by the beam profiler 152 as the ion beam is scanned laterally back and forth in time. As shown, when the magnetic field in FIG. 4C is at approximately zero magnitude (e.g., at time "d"), the beam current in FIG. 4D can exhibit undesired ZFE conditions, such as "spikes" (e.g., 212) or "dips," relative to a baseline beam current 214.

Figure 4E:
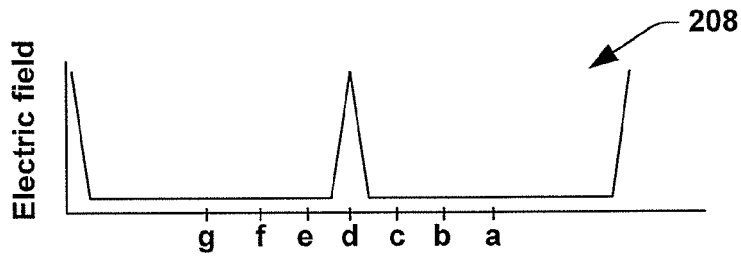

The analysis circuitry 184 analyzes this beam current 206 to detect any ZFE conditions that may be present. If the analysis circuitry 184 detects a ZFE condition, the analysis circuitry (which is coupled to the ZFE-limiting element 180 via a wired or wireless feedback path 186), provides a feedback signal which induces a change in the voltage applied to the electrodes of the ZFE-limiting element 180. This selectively applied voltage can induce a corresponding electric field 208, such as shown in FIG. 4E, in the ZFE-affected region of the beam path, thereby limiting the ZFE condition. The selective application of the electric field depends on whether the ZFE condition is detected—for example, if ZFE condition is detected, then electric field is changed or is turned on; but if ZFE condition is not detected, then electric field remains unchanged or is turned off. If the ZFE is detected the value of electric field applied can be predetermined from operating data acquired by scanning different beams with different ion energies, mass, species etc. Alternatively an iterative process can be used, where the electric field is applied, the current density distribution is measured, and if the density is not sufficiently uniformly distributed the electric field is adjusted, until a desired uniformity is obtained.

In one embodiment, a voltage is selectively applied to electrode plates 182a, 182b, which are downstream of the magnetic scanner 136, to induce the selective, ZFE-limiting electric field. In alternative embodiments, the voltage is applied to a ring-shaped electrode downstream of the magnetic scanner 136 to induce the selective, ZFE-limiting electric field, although other electrode arrangements are also possible. In general, the electric field may be introduced at any location near the magnetic scanner to alter the beam current density (e.g., to enhance the magnetized beam neutralization) and accordingly, limit the effect of ZFE.

Figure 4F:
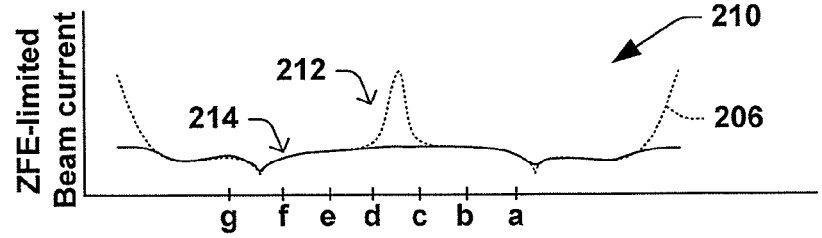
Figure 4G:
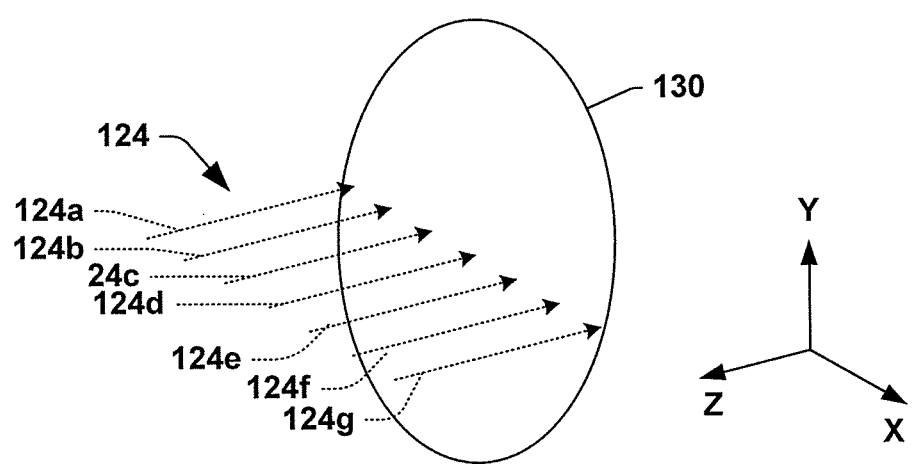

The result after correction by the ZFE-limiting element, as shown in FIG. 4F, is an ion beam that exhibits limited ZFE conditions. As can be seen, after being passed through the ZFE-limiting element, the resultant ion beam 210 has a relatively constant baseline current density, even in regions where a ZFE condition (e.g., 212) previously occurred.

Figure 5:
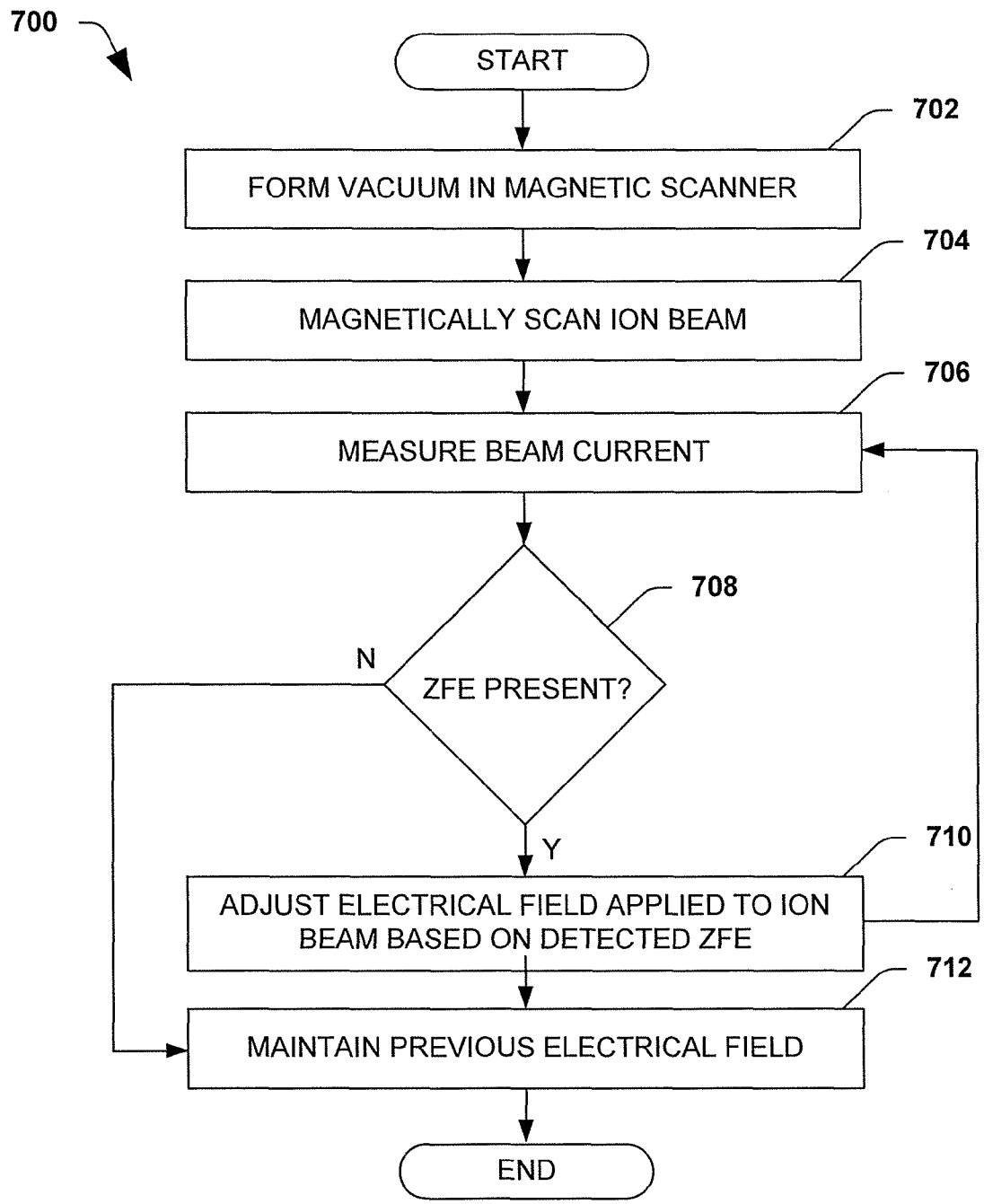
FIG. 5 illustrates a flow diagram of a method for iteratively changing an electric field applied to the scanner region of an ion implanter to improve productivity and uniformity of a scanned beam.

FIG. 5 illustrates an exemplary method 500 for limiting a ZFE condition in an ion implantation system utilizing a magnetic scanner. The method iteratively adjusts an electric field waveform applied via a ZFE limiting element to a magnetically scanned beam until an optimum electric field waveform is achieved to provide a beam current across the surface of a wafer which is sufficiently high to remove the effect of ZFE. More particularly, a beam current is measured to determine a ZFE and to iteratively tune the manner in which electric field is incrementally introduced to optimize beam neutralization of a magnetic ion beam and to reduce the effect of ZFE on the ion beam.

At 502 the ion beam is first tuned while the scanning system is off to establish desired operating conditions. During this process, a vacuum is provided in the beam line of the ion implantation system. High vacuum pumps evacuate the beamline and process chamber to extremely low pressures (e.g., $<10^{-6}$ Torr), until only a small amount of residual gas remains. However, the extent of ion beam neutralization resulting from this beam/injected gas interaction may be insufficient to support beam neutralization in the presence of a magnetic field.

At 504 the ion beam is scanned across a scan path. The scan path is the path that the ion beam (e.g., a pencil beam) will traverse as it is moved by the force of a varying magnetic field, produced by a magnetic scanning system comprising two magnetic poles (e.g., electromagnetic coils), resulting in a ribbon beam. In one embodiment, the scan path may extend across the width of a targeted workpiece. The ion beam may be scanned over the scan path at a scan rate that is dependent upon the time dependence of the magnetic field (e.g., as the magnetic field changes the position of the ion beam on the scan path changes).

A beam current and/or density is measured at 506. The beam current of the ribbon beam can then be measured over a scan path. In one embodiment the beam current may be measured using a faraday cup. A faraday cup is a conductive cup that may be configured in proximity to the workpiece to capture charged particles from the ion beam. When particles from the ion beam hit the conductive cup, it gains a small net charge. The cup can then be discharged periodically to provide a small charge, equivalent to the number of impinging ions, to an attached circuit in each period. By measuring the charge, the beam current of the ion beam can be determined. The faraday cup, therefore provides the beam current as a function of time.

In an alternative embodiment, the beam current can be measured using one or more profilers configured to measure the beam current across the width of the ribbon beam. The profilers may continuously traverse a profiler path (e.g., across the width of a workpiece), thereby measuring the profile of scanned ion beams. In one embodiment a profiler may comprise a moving faraday cup.

Zero field anomalies (i.e., zero field effects (ZFE)) are identified at 508. A ZFE may be determined in a measured beam current as a local increase or decrease in the measured beam current at a location where the magnetic field is zero. The increase or decrease may comprise a change in the measured beam current that is greater or smaller, respectively, than a certain threshold value. In other words, a ZFE is characterized as a change in the measured beam current (e.g., a rise or drop in the measured beam current) at a location where the magnetic field is zero.

If a ZFE is detected then the magnitude of the electric field is adjusted in response at 510. The adjustment may comprise comparing the beam current and density at multiple scan positions and adjusting the electric field to minimize the difference between these beams measured at multiple scan positions. Actions 502-510 may be iteratively performed in a manner which tunes the beam current by an incremental changes in electric field. It will be appreciated that the change in electric field magnitude over the various iterations may be small, thereby increasing or decreasing the beam current in a gradual manner. After respective adjustments of the electric field, the beam current can be re-measured and if a ZFE is still measured then the electric field may be iteratively readjusted until a satisfactory reading is achieved.

If a ZFE is not detected, the electric field of the system is maintained at 512, since it is not necessary to mitigate the ZFE. Thus, an electric field condition can be maintained to effectively minimize the effect of the ZFE. It will be appreciated that measurements may still be taken and in the event of a ZFE being detected the method 500 may be reinstated in response to the measured ZFE.

Figure 6:
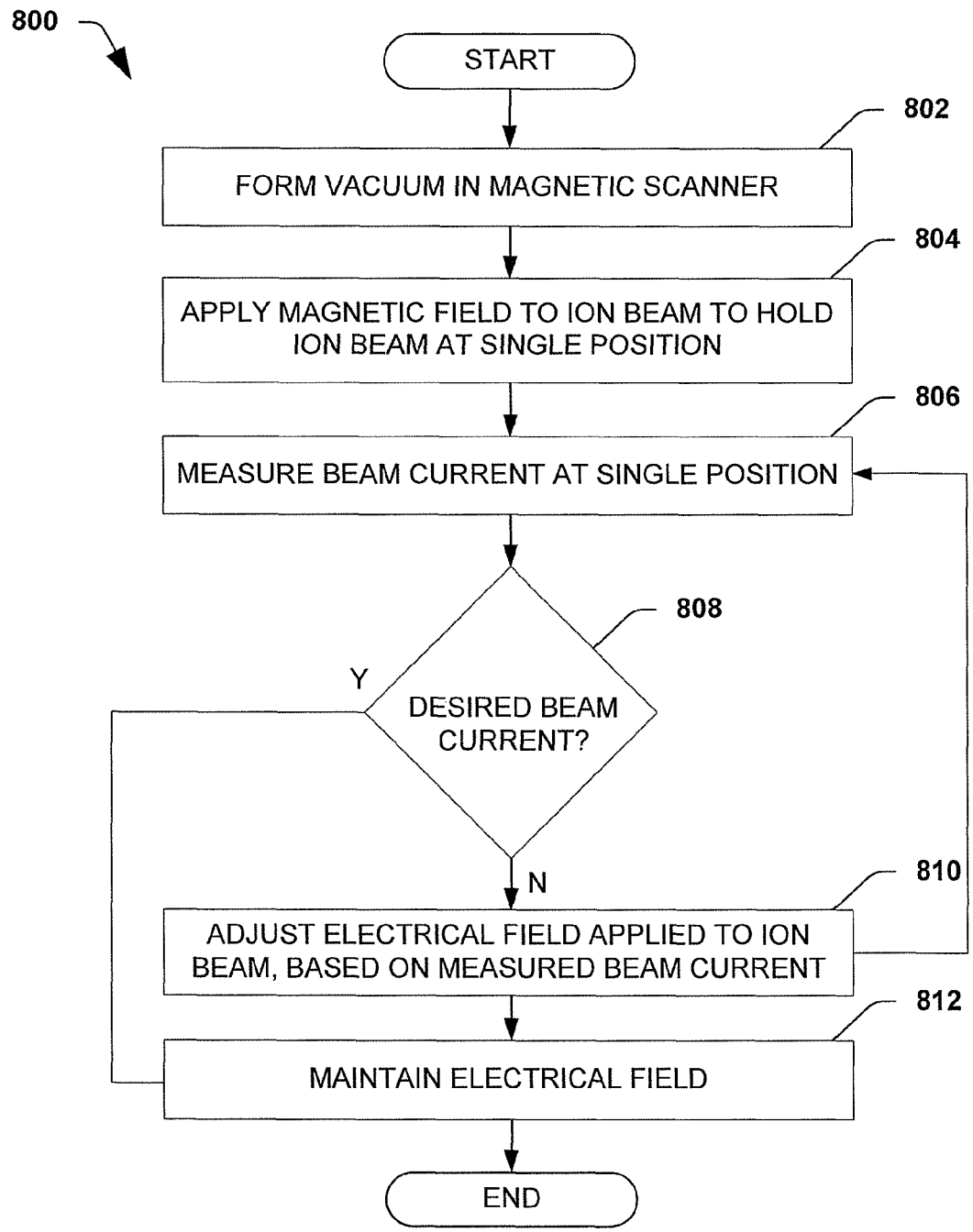
FIG. 6 illustrates an alternative exemplary method for optimizing an electric field in a scanner.

FIG. 6 illustrates an alternative exemplary method 600 for optimizing an electric field in a magnetic scanner. In the method 600, the beam current and/or density is measured at a single position along the scan path. The electric field can be introduced, in response to the measured beam current and/or density, to achieve some desired change in the beam current and/or density at this single position. It will be appreciated that such an embodiment may be used as a test or calibration method that can be run prior to production. Such an embodiment may allow for faster measurement times and improved performance of the tuning.

At 600, the ion beam is tuned while the scanning system is off to establish desired operating conditions. During this process, a vacuum is provided in the beam line of the ion implantation system.

A magnetic field is applied to the ion beam to hold the ion beam at a single position at 604. The magnetic field may cause the ion beam to move to a position off center due to the force of a magnetic field.

At 606 a beam current and/or density is measured. The beam current of the ion beam is measured at a single position along the scan path. In one embodiment the beam current may be measured using a faraday cup or using one or more profilers configured to measure the beam current. If the beam current does not achieve a predetermined desired value, the electric field may be adjusted at 610. If the beam current achieves the predetermined desired value, the condition of the electric field may be maintained.

Actions 604-610 may be iteratively performed in a manner which tunes the beam current by an incremental change in electric field. After respective adjustments of the electric field, the beam current can be re-measured and if a ZFE is still measured then the electric field may be iteratively readjusted until a satisfactory reading is achieved.

Although the invention has been shown and described with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention. In this regard, it will also be recognized that the invention includes a computer-readable medium having computer-executable instructions for performing the steps of the various methods of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising".

What is claimed is:

1. An ion implantation system comprising:
    an ion source configured to generate an ion beam along a beam path;
    a mass analysis component downstream of the ion source configured to perform mass analysis on the ion beam;
    a scanning element located downstream of ion source configured to produce a time-varying field which operates upon the ion beam to produce a scanned beam that traverses a scan path;
    a beam profiling system configured to measure a beam current of the scanned beam as the scanned beam traverses the scan path;
    an analysis system to analyze the measured beam current to detect a zero field effect (ZFE) condition arising from scanning;
    a ZFE-limiting element upstream of the beam profiler and coupled to the analysis system via a feedback path, wherein the ZFE-limiting element is configured to limited the ZFE condition, if detected, by selectively applying an electric field to the ion beam based on whether a ZFE condition was detected.

2. The ion implantation system of claim 1, where the ZFE limiting element applies the electric field only when a ZFE condition has been detected.

3. The ion implantation system of claim 1, where the time varying field provided by the scanning element is a time-varying magnetic field.

4. The ion implantation system of claim 1, where the time varying field provided by the scanning element is a time-varying electric field.

5. The ion implantation system of claim 1, wherein the beam profiling system comprises a faraday cup proximate to an end station of the ion implantation system and configured to measure the beam current or density of the ion beam.

6. The ion implantation system of claim 1, wherein the ZFE-limiting element is configured to incrementally change a voltage waveform based on whether a ZFE condition is detected.

7. The ion implantation system of claim 6, wherein the analysis system detects the ZFE condition by determining whether a beam current at some position on the scan path exceeds a base beam current along the scan path.

8. The ion implantation system of claim 1, wherein the ZFE-limiting element comprises a ring shaped electrode having an inner perimeter that at least substantially surrounds an outer perimeter of a cross-section of the ion beam.

9. The ion implantation system of claim 1, wherein the ZFE-limiting element comprises at least one plate electrode close to the ion beam.

10. A scanning system for an ion implantation system, comprising:
a magnetic scanner comprising a first magnetic pole and a second magnetic pole configured to produce a magnetic field to scan an ion beam over an ion beam scan path;
a beam profiler to measure beam current of the ion beam as the ion beam is magnetically scanned over the ion beam scan path;
an analysis system to analyze the measured beam current to detect a zero field effect (ZFE) condition occurring in at least one scan position on the ion beam scan path;
a ZFE-limiting element upstream of the beam profiler and coupled to the analysis system via a feedback path, wherein the ZFE-limiting element is configured to selectively apply an electric field to the ion beam based on whether the ZFE condition is detected, wherein the selectively applied electric field induces a change in the ion beam to limit the ZFE condition.

11. The scanning system of claim 10, wherein the ZFE condition is detected by determining whether the measured beam current for the at least one scan position exceeds a base level for beam current by a predetermined threshold.

12. The scanning system of claim 10, wherein the ion beam comprises an ion pencil beam running along a beam path and having a trajectory that is modified into a ribbon beam as it passes through the magnetic field.

13. The scanning system of claim 10, wherein the ZFE-limiting element comprises a ring shaped electrode having an inner perimeter that at least substantially surrounds an outer perimeter of a cross-section of the ion beam.

14. The scanning system of claim 10, wherein the ZFE-limiting element comprises at least one plate electrode close to the ion beam.

15. A method for improving uniformity of magnetically scanned ion beams in an ion implantation system, comprising:
scanning an ion beam having a beam current or density across a scan path at a scan rate; and
analyzing the scanned ion beam to determine whether a zero-field effect (ZFE) condition is present; and
selectively applying an electric field to the ion beam to mitigate the ZFE condition.

16. The method of claim 15, wherein analyzing the scanned ion beam comprises measuring a beam current signal as the ion beam is scanned across the scan path.

17. The method of claim 16, wherein the beam current signal is measured by a faraday cup.

18. The method of claim 15, wherein the selectively applied electric field is applied only when a ZFE condition has been detected.

19. The method of claim 15, where scanning the ion beam comprises applying a time-varying magnetic field to the ion beam.

20. The method of claim 15, where scanning the ion beam comprises applying a time-varying electric field to the ion beam.

* * * * *